(12) United States Patent
Kuo et al.

(10) Patent No.: US 7,033,185 B2
(45) Date of Patent: Apr. 25, 2006

(54) FLEXIBLE CIRCUIT BOARD

(75) Inventors: Min-Chien Kuo, Lugang Township, Changhua County (TW); Che-Chih Chang, Taichung (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 10/863,429

(22) Filed: Jun. 8, 2004

(65) Prior Publication Data

US 2005/0202693 A1    Sep. 15, 2005

(30) Foreign Application Priority Data

Mar. 9, 2004    (TW) ............................... 93106132 A

(51) Int. Cl.
*H01R 12/00* (2006.01)
*H05K 1/00* (2006.01)

(52) U.S. Cl. ........................................ 439/67; 349/150

(58) Field of Classification Search ................... 439/67; 349/150

See application file for complete search history.

(56) References Cited

U.S. PATENT DOCUMENTS 6,903,369 B1 *    6/2005    Chen et al. ................... 257/59

* cited by examiner

*Primary Examiner*—Javaid H. Nasri
(74) *Attorney, Agent, or Firm*—Thomas, Kayden, Horstemeyer & Risley

(57) ABSTRACT

A flexible circuit board. The flexible circuit board is connected to an LCD module, comprising a first conductive portion, a second conductive portion, a third conductive portion, a conductive trace and a slot. The second conductive portion is disposed at the border of flexible circuit board and comprises a first contact pad. The third conductive portion is located between the first and second conductive portions. The conductive trace comprises a first trace segment a second trace segment. The first conductive segment connects the first conductive portion with the first contact pad, and the second trace segment connects the second conductive portion with the third conductive portion, wherein the slot is formed between the first and second trace segments.

6 Claims, 7 Drawing Sheets

FLEXIBLE CIRCUIT BOARD

BACKGROUND

The present invention relates in general to a flexible circuit board and in particular to a flexible circuit board connected to an LCD module, preventing open circuits and trace damage.

Conventional flat panel modules, such as LCD modules, are generally connected to external circuits through flexible circuit boards. As shown in FIG. 1a, the flexible circuit board 1 comprises first, second and third conductive portions 11, 12 and 13 for signal transmission, wherein the first and second conductive portions 11 and 12 are disposed on the opposite borders of the flexible circuit board 1. The first conductive portion 11 comprises a plurality of contact pads 110 electrically connected to external circuits (not shown), and correspondingly, the second conductive portion 12 comprises a plurality of contact pads 120 electrically connected to an LCD module M.

Specifically, a U-shaped slot 10 is defined on the flexible circuit board 1 forming a flexible portion 130. Referring to FIGS. 1a and 1b, the third conductive portion 13 is disposed on the flexible portion 130 and electrically connected to the LCD module M as the flexible portion 130 is flexed upward. As shown in FIG. 2, the flexible circuit board 1 comprises a conductive trace T routed as a U-turn detouring the slot 10 from the contact pads 110 of the first conductive portions 11 to the third conductive portion 13 for signal transmission. The flexible circuit board 1, however, can be easily torn at both ends of the U-shaped slot 10 as indicated by the dashed lines in FIG. 2 as the flexible portion 130 is flexed.

SUMMARY

Accordingly, an object of embodiments of the present invention is to provide a flexible circuit board preventing open circuits and trace damage. The flexible circuit board is connected to an LCD module, comprising a first conductive portion, a second conductive portion, a third conductive portion, a conductive trace and a slot. The second conductive portion is disposed at the border of flexible circuit board and comprises a first contact pad. The third conductive portion is located between the first and second conductive portions. The conductive trace comprises a first trace segment and a second trace segment. The first conductive segment connects the first conductive portion with the first contact pad, and the second trace segment connects the second conductive portion with the third conductive portion, wherein the slot is formed between the first and second trace segments.

BRIEF DESCRIPTION OF THE DRAWINGS

Embodiments of the present invention will become more fully understood from the detailed description given hereinbelow and the accompanying drawings, given by way of illustration only and thus not intended to be limitative of embodiments of the present invention.

DETAILED DESCRIPTION

FIRST EMBODIMENT

Figure 1A:
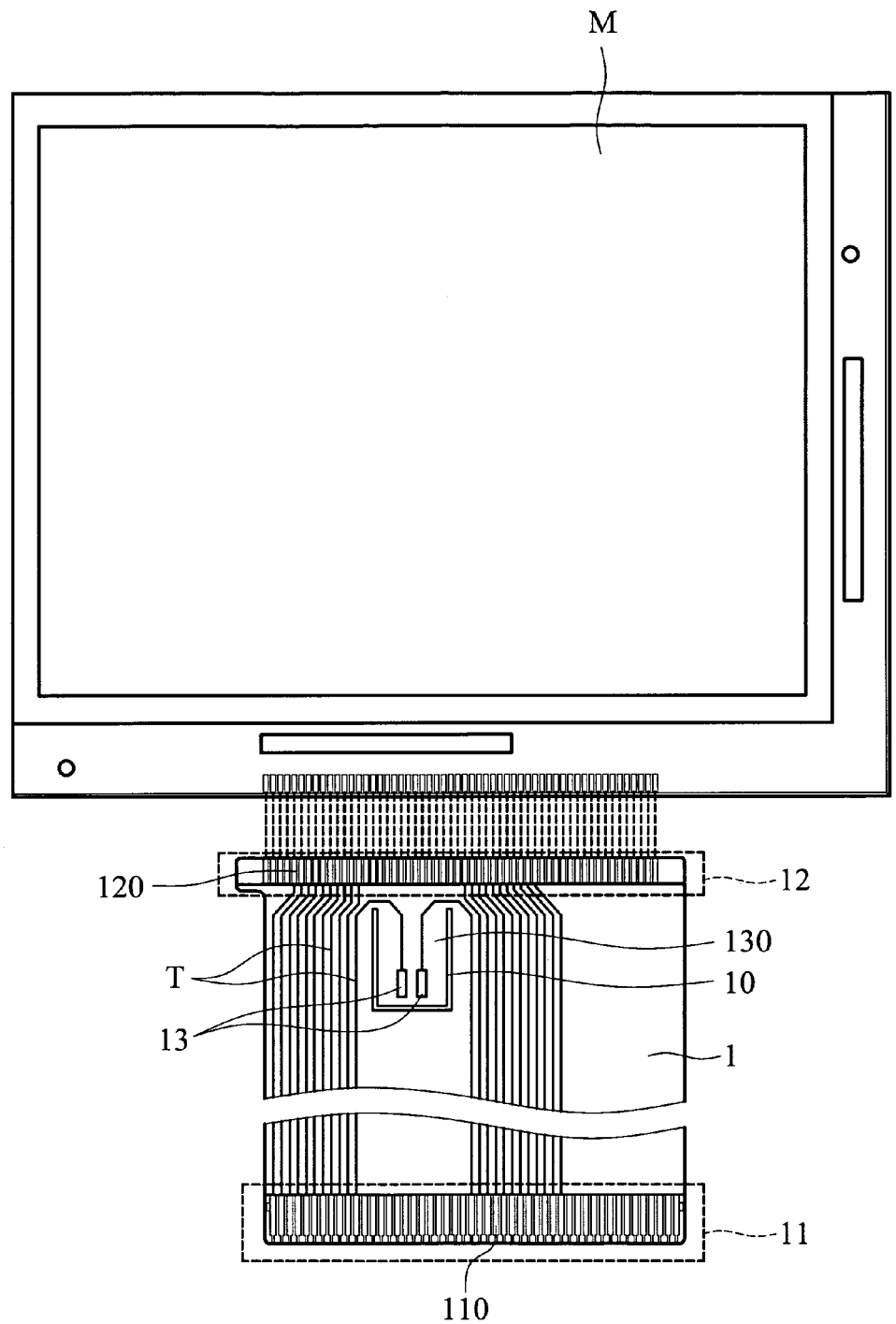
FIGS. 1a and 1b are perspective diagrams of a conventional flexible circuit board connected to an LCD module.
Figure 1B:
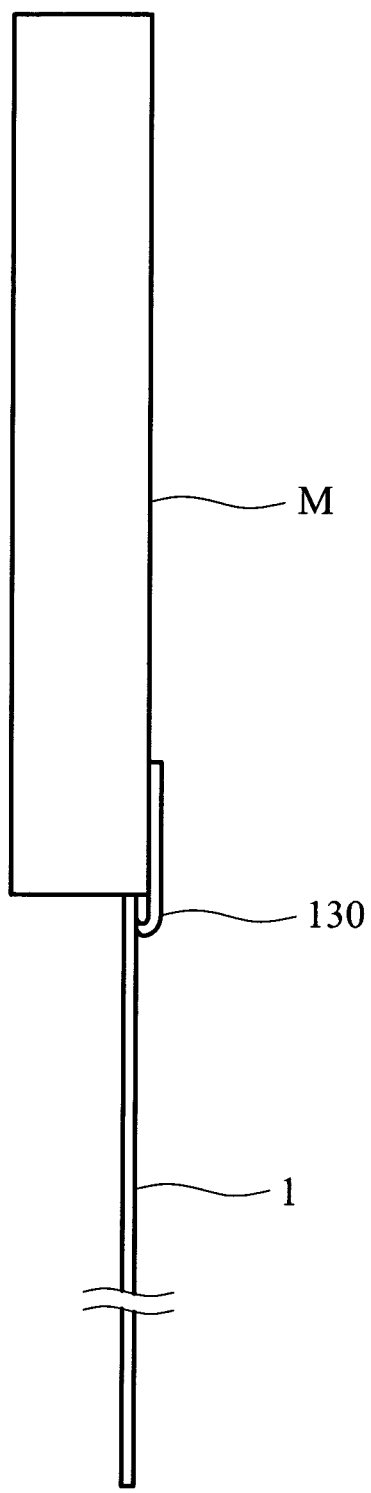
Figure 2:
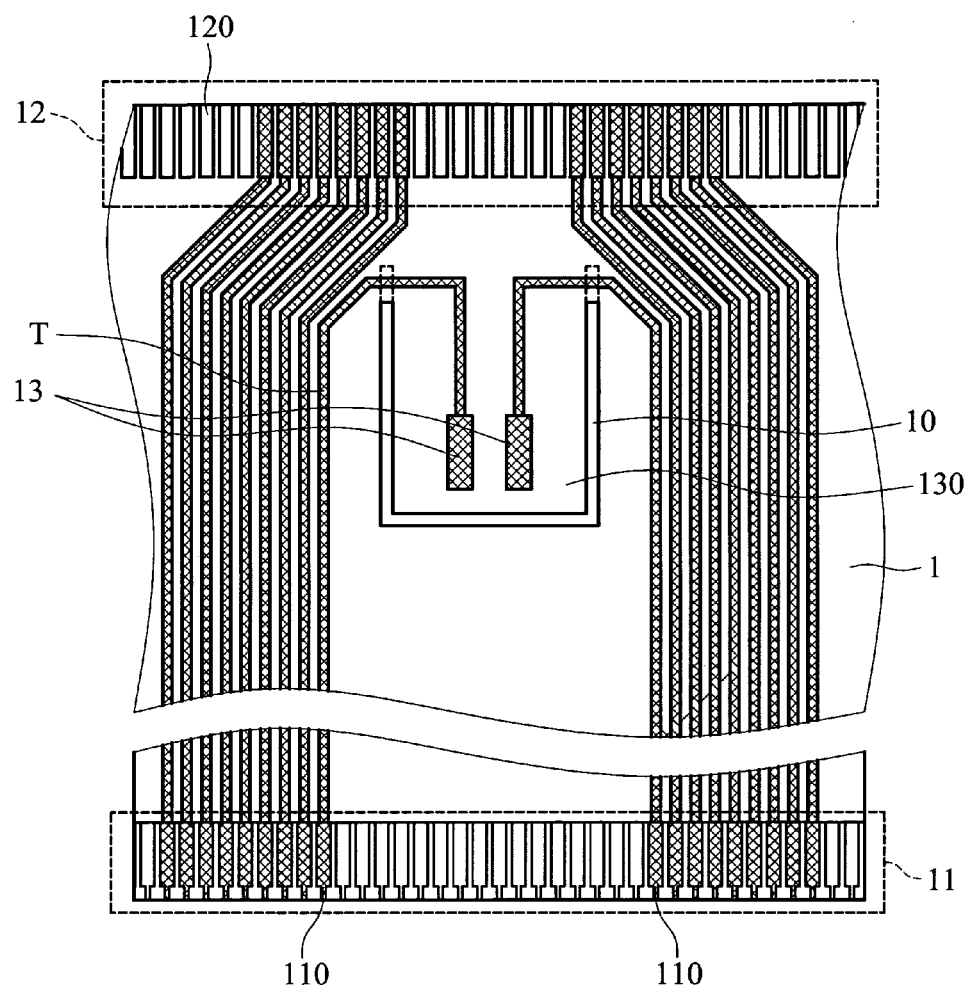
FIG. 2 is a perspective diagram of the conventional flexible circuit board routing methodology.
Figure 3:
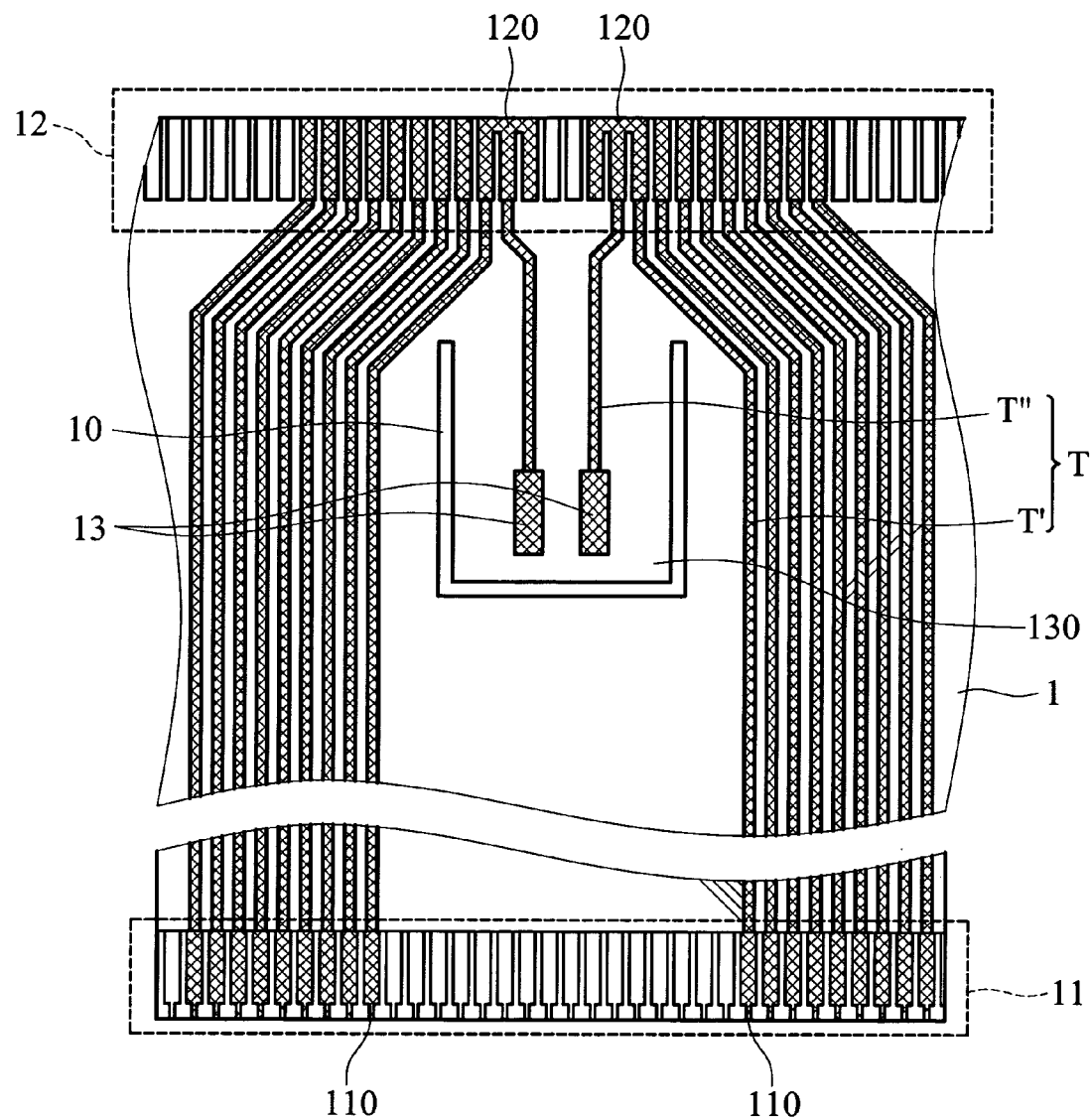
FIG. 3 is a perspective diagram of the first embodiment in accordance with the present invention.

The flexible circuit board of the present invention is applied to a panel display module, such as an LCD module. Referring to FIG. 3, a conductive trace T is routed on the flexible circuit board 1, comprising first and second trace segments T', T". The first conductive trace segment T' electrically connects the first and second conductive portions 11 and 12, and the second trace segment T" electrically connects the second and third conductive portions 12 and 13. As shown in FIG. 3, the conductive trace T connects a plurality of contact pads 120 in the second conductive portion 12, however, it can also connect to only a single contact pad 120. Signal transmission from the contact pads 120 to the third conductive portion 13 is accomplished via the second trace segment T" connected therebetween.

As mentioned, the first conductive trace T is routed to the second conductive portion 12 and connected to the contact pads 120. Further, the first conductive trace T is routed downward to the third conductive portion 13 such that the distance between the trace T and the slot 10 increases. Thus, open circuits and trace damage can be prevented if the flexible circuit board 1 is torn along the slot 10 as the flexible portion 130 is flexed. The first and second conductive portions 11, 12 can be respectively connected to a system and an electronic component such as an LCD panel.

SECOND EMBODIMENT

Figure 4:
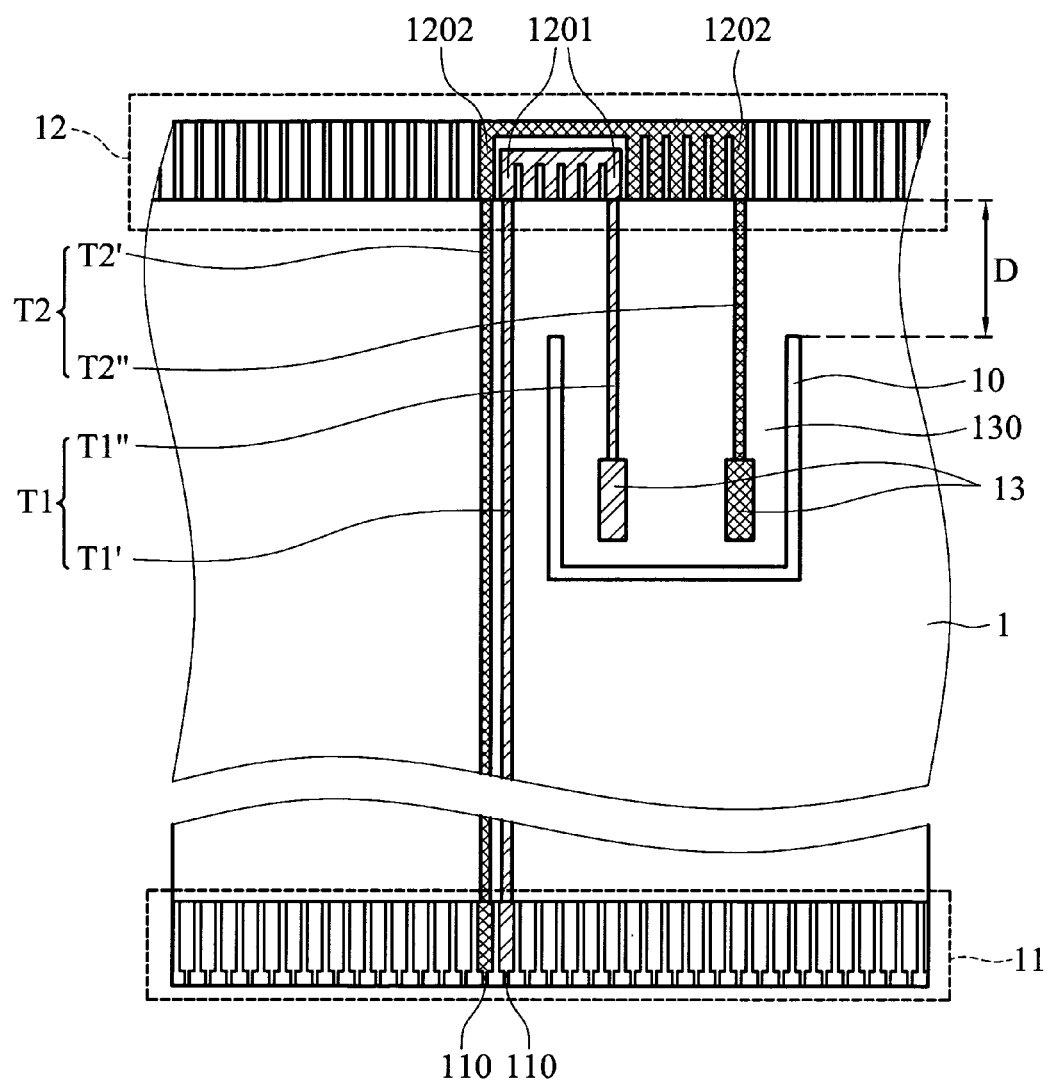
FIG. 4 is a perspective diagram of the second embodiment in accordance with the present invention.

Referring to FIG. 4, the second conductive portion 12 comprises a plurality of first and second contact pads 1201, 1202. The first contact pads 1201, carrying a first signal, are aligned adjacent to each other and electrically connected. Moreover, the first contact pads 1201 are disposed between the second contact pads 1202 carrying a second signal. In this embodiment, a first conductive trace T1, connecting the first contact pads 1201, comprises a first trace segment T1' and a second trace segment T1". A second conductive trace T2, connecting the second contact pads 1202, comprises a third trace segment T2' and a fourth trace segment T2".

As shown in FIG. 4, the first trace segment T1' electrically connects the first conductive portion 11 with a first contact pad 1201, and the second trace segment T1" electrically connects another first contact pad 1201 with the third conductive portion 13. Furthermore, the third trace segment T2' electrically connects the conductive portion 11 with a second contact pad 1202, and the fourth trace segment T2" electrically connects another second contact pad 1202 with the third conductive portion 13.

As mentioned, the first contact pads 1201 are disposed between the second contact pads 1202, and the second conductive trace T2 partially encircles the first conductive trace T1, wherein an end of the U-shaped slot 10 is formed between the first and second trace segments T1' and T1". In FIG. 4, the first conductive trace T is routed upward through the second conductive portion 12 then downward to the third conductive portion 13, such that the distance D between the trace and the slot 10 increases. Thus, open circuits and trace damage can be prevented if the flexible circuit board 1 is torn along the slot 10 as the flexible portion 130 is flexed.

Moreover, the first and second conductive portions 11, 12 can be respectively connected to a system and an electronic component such as an LCD panel. With respect to various electrical circuits, however, more than two traces can also be appropriately applied to an embodiment of the present invention.

THIRD EMBODIMENT

Figure 5:
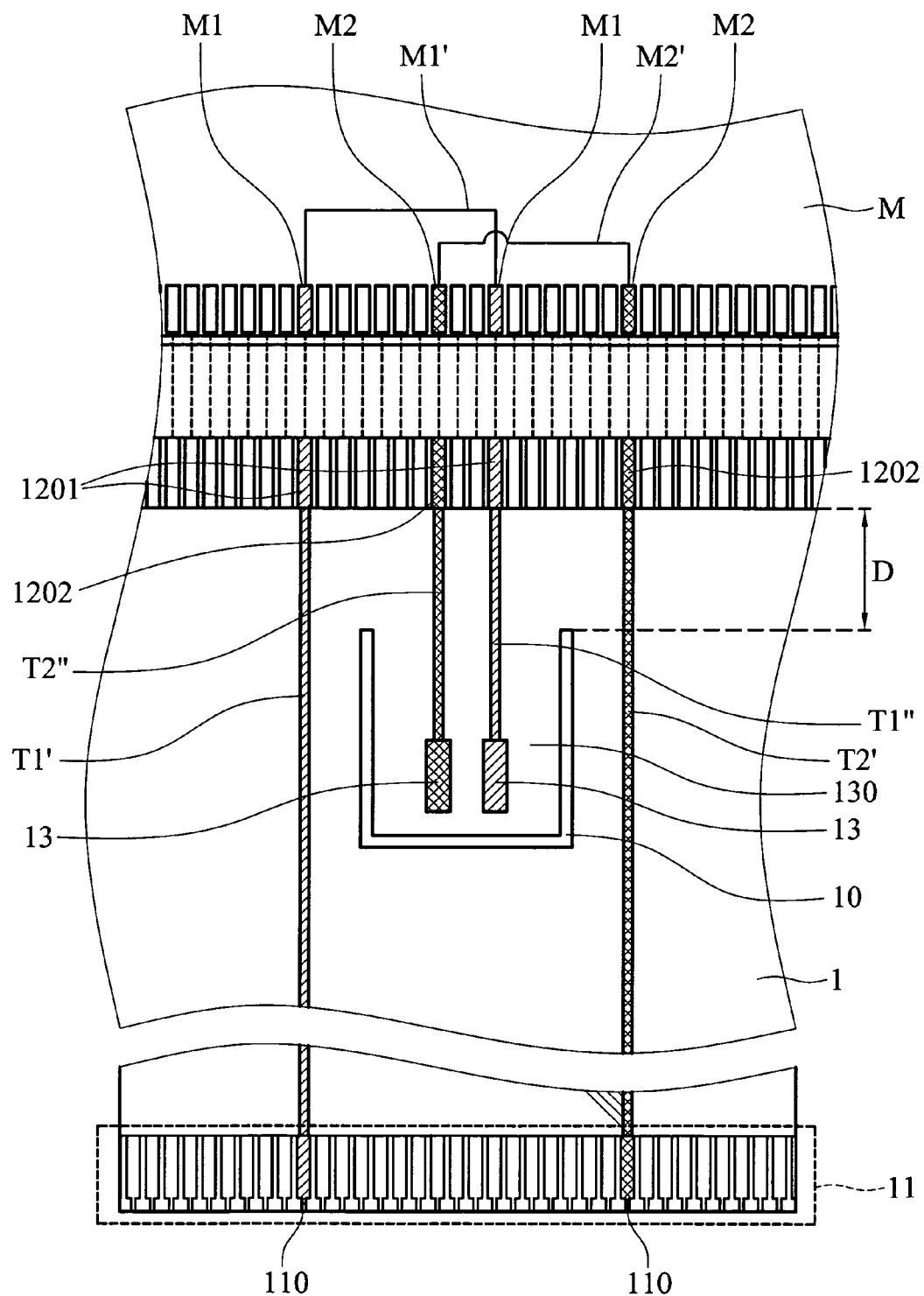
FIG. 5 is a perspective diagram of the third embodiment in accordance with the present invention.

As shown in FIG. 5, the first contact pads 1201 and the second contact pads 1202, respectively, are electrically connected to each other but not adjacent. In this embodiment, the first contact pads 1201 are connected to the first joining contact pads M1 on the LCD module M, and correspondingly, the second contact pads 1202 are connected to the second joining contact pads M2. In FIG. 5, the first and second contact pads 1201 and 1202 are electrically connected by the conductive traces M1' and M2' on the LCD module M respectively. That is, the first contact pads 1201, the first joining contact pads M1 and the conductive trace M1' form an independent circuit carrying a first signal, and correspondingly, the second contact pads 1202, the second joining contact pads M2 and the conductive trace M2' form another independent circuit carrying a second signal. In this embodiment, whether the contact pads 1201 and 1202 are adjacent or not, two independent circuits can be accomplished via the conductive traces M1' and M2' through the LCD module M.

In FIG. 5, a first trace segment T1' electrically connects the first conductive portion 11 with a first contact pad 1201, and a second trace segment T1" electrically connects another first contact pad 1201 with the third conductive portion 13. Moreover, a third trace segment T2' electrically connects the first conductive portion 11 with the second contact pad 1202, and a fourth trace segment T2" electrically connects another second contact pad 1202 with the third conductive portion 13.

As the conductive traces are routed upward through the second conductive portion 12 then downward to the third conductive portion 13, the distance D between the trace and the slot 10 increases, such that open circuits and trace damage can be prevented if the flexible circuit board 1 is torn along the slot 10. Moreover, as independent circuits can be accomplished via the conductive traces M1', M2' through the LCD module M, the first and second contact pads 1201 and 1202 can be assigned to any position of the second conductive portion 12, facilitating the circuit design procedure.

FOURTH EMBODIMENT

Figure 6:
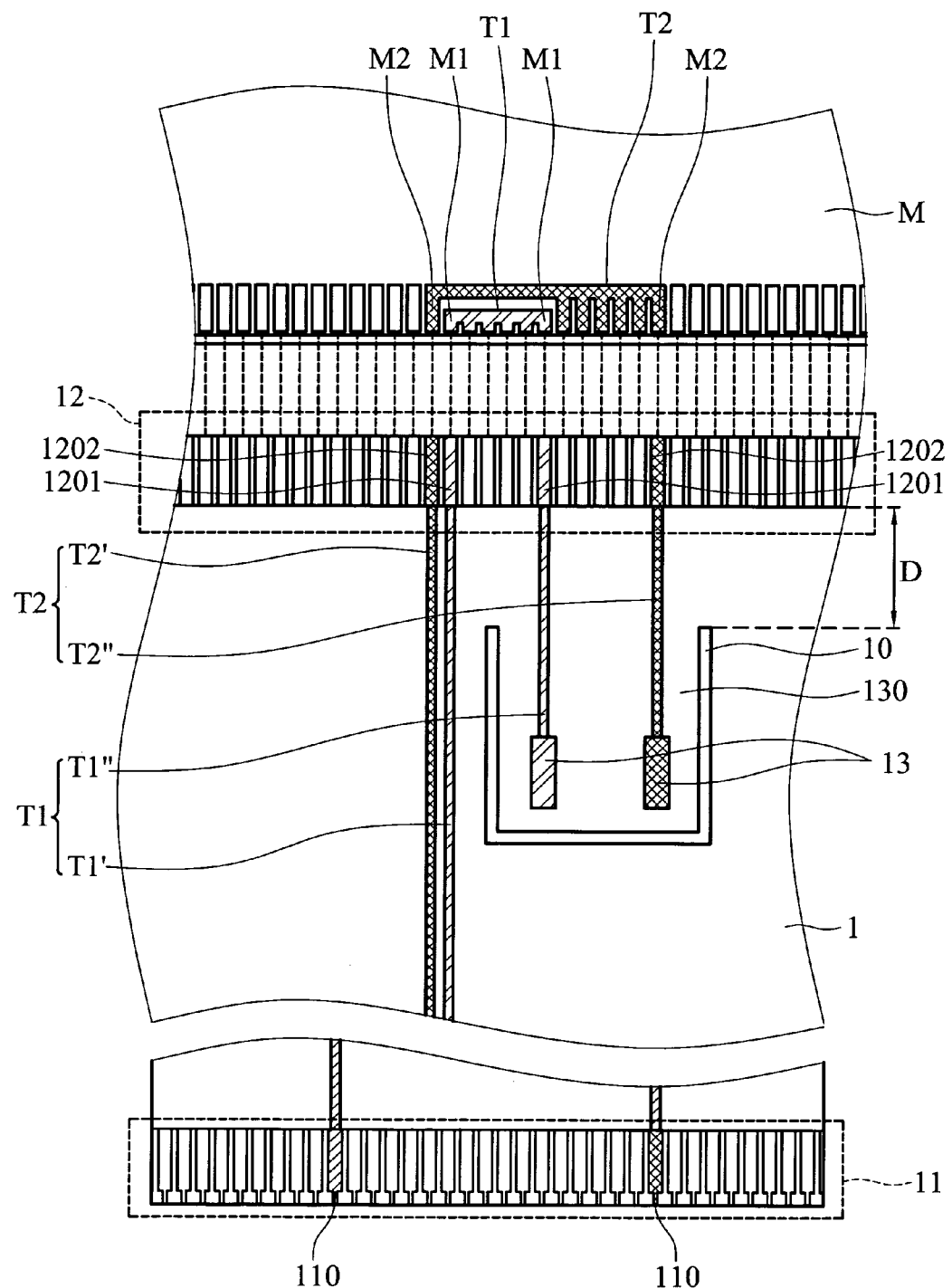
FIG. 6 is a perspective diagram of the fourth embodiment in accordance with the present invention.

Referring to FIG. 6, a plurality of first and second contact pads 1201 and 1202 of the second conductive portion 12 respectively connect to the corresponding first and second joining contact pads M1 and M2 on the LCD module M. The first joining pads M1 are aligned adjacent to each other carrying a fist signal. The second contact pads 1202, carrying a second signal, are arranged with the first contact pads 1201 disposed therebetween.

In FIG. 6, the first trace segment T1' electrically connects the first conductive portion 11 with a first contact pad 1201, and the second trace segment T1" electrically connects another first contact pad 1201 with the third conductive portion 13. Furthermore, the third trace segment T2' electrically connects the conductive portion 11 with a second contact pad 1202, and the fourth trace segment T2" electrically connects another second contact pad 1202 with the third conductive portion 13. Specifically, the first and second contact pads 1201 and 1202 are respectively connected by the conductive traces T1 and T2 routed through the first and second joining pads M1 and M2 on the LCD module M. As shown in FIG. 6, the second conductive trace T2 partially encircles the first conductive trace T1 on the LCD module M, wherein an end of the U-shaped slot 10 is formed between the first and second trace segments T1' and T".

As mentioned, the conductive traces T1 and T2 are routed upward through the second conductive portion 12, the first and second joining pads M1, M2 of the LCD module M. As the conductive traces T1 and T2 are further routed downward to the third conductive portion 13 from the upper second conductive portion 12 via the third and fourth trace segments T1" and T2", the distance D between the trace and the slot 10 increases. Thus, open circuits and trace damage can be prevented if the flexible circuit board 1 is torn along the slot 10 as the flexible portion 130 is flexed. Moreover, the first and second conductive portions 11 and 12 can be respectively connected to a system and an electronic component such as an LCD panel. With respect to various electrical circuits, however, more than two traces can also be appropriately applied to an embodiment of the present invention.

Embodiments of the present invention provide a flexible circuit board comprising a conductive trace routed as a U-turn near the conductive joint of an electronic component such as the LCD module M. Signal transmission is accomplished by the conductive traces routed from the first conductive portion 11 through the second conductive portion 12 to the third conductive portion 13. The routing methodologies of the above-mentioned second, third and fourth embodiments can be combined and applied to a single flexible circuit board. It is also practicable applying the routing methodologies to both electronic component (the LCD module M) and the flexible circuit board based on FIGS. 5 and 6.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A flexible circuit board, comprising:
   a first conductive portion;
   a second conductive portion disposed at the border of flexible circuit board, comprising a first contact pad;
   a third conductive portion located between the first and second conductive portions;
   a first conductive trace, comprising a first trace segment and a second trace segment,
      wherein the first trace segment connects the first conductive portion with the first contact pad, and the second trace segment connects the second conductive portion with the third conductive portion; and
   a slot formed between the first and second trace segments.

2. The flexible circuit board as claimed in claim 1, wherein the second conductive portion comprises a plurality of first contact pads, the first trace segment connects the first conductive portion wit one first contact pad, and the second trace segment connects one first contact pad wit the third conductive portion.

3. The flexible circuit board as claimed in claim 2, wherein the first contact pads are aligned adjacent to each other.

4. The flexible circuit board as claimed in claim 2 further comprising a second conductive trace and the second conductive portion comprises a plurality of second contact pads with the first contact pads disposed therebetween.

5. The flexible circuit board as claimed in claim 4, wherein the second conductive trace and to second contact pads partially encircle the first contact pads in the first conductive portion.

6. The flexible circuit board as claimed in claim 5, wherein the second conductive trace comprises a third trace segment and a fourth trace segment, wherein the third trace segment connects the first conductive portion with one of the second contact pads, and the fourth trace segment connects one of the second contact pads with the third conductive portion.

* * * * *